METHOD OF RECLAIMING PROCESSED SEMICONDUCTOR WAFERS

Filed Nov. 27, 1968

INVENTORS
Bobby A. Mayberry
Albert E. Ozias, Jr.
BY
Mueller, Aichele & Rauner
Att'ys 3,559,281

METHOD OF RECLAIMING PROCESSED SEMICONDUCTOR WAFERS

Bobby A. Mayberry and Albert E. Ozias, Jr., Tempe, Ariz., assignors to Motorola, Inc., Franklin, Park, Ill.

Filed Nov. 27, 1968, Ser. No. 779,489
Int. Cl. B01j *17/00;* H01l *7/12*
U.S. Cl. 29—575 7 Claims

ABSTRACT OF THE DISCLOSURE

A method of processing semiconductor wafers wherein wafers having epitaxial layers containing diffusion regions which have been rejected due to electrical failures or visual defects can be economically processed and reclaimed for further device fabrication. The method utilizes the combination of an epitaxial layer and an overlying oxide layer to essentially eliminate auto-doping by impurities diffused or contained therein during subsequent fabrication steps.

BACKGROUND OF THE INVENTION

This invention relates to a method for processing partially fabricated semiconductor wafers having epitaxial layers containing diffusion regions formed therein.

In the fabrication of semiconductor devices such as transistors and integdated circuits, it is desirable to have a high resistivity epitaxial layer formed on a low resistivity semiconductive substrate. This combination of substrate and epitaxial layer is recognized as providing relatively high voltage junctions. Forming a high resistivity layer on a low resistivity substrate presents significant problems during fabrication in that there is a tendency for the dopant impurities contained in the substrate to contaminate the epitaxial layer. This contamination process is commonly referred to as auto-doping and describes the movement via a gas phase of impurities from the substrate to the epitaxial layer during layer formation. The effect of auto-doping is to limit the resistivity of the epitaxial layer to an undesirably low value. In practice, the lower the resistivity of the substrate, the lower the upper limits of resistivity are for the epitaxial layer.

Since the fabrication of semiconductor devices, such as transistors, diodes and integrated circuits, requires a large number of processing steps, a relatively large number of intervals in the process are available to conduct intermediate tests or checks of the product being fabricated. If at any point during the fabrication the device is found unacceptable it can be withdrawn from the fabrication process. In practice, the steps required during fabrication are relatively sensitive and complex. Consequently, it is not unusual to find the number of rejected partially fabricated wafers to be of the order of tens of percents. Since the processes themselves are relatively new, the major scientific effort has been heretofore directed to the improvement of yield of these individual processing steps. The problem of reclaiming the rejected partially fabricated semiconductor wafers has not been successfully attacked. The common practice presently utilized is to reject and scrap the wafers. Since reject rates are quite high, this additional cost is relatively large.

One technique for reclaiming partially fabricated semiconductor wafers which do not satisfy test requirements during fabrication is described in our copending patent application S.N. 643,475, now abandoned, entitled "Semiconductor Processing" and assigned to the instant assignee. Briefly, this process enables semiconductor wafers having imperfect or unacceptable epitaxial layers to be removed from the fabrication process prior to the subsequent diffusion steps. This process relies on the use of this imperfect epitaxial layer to control in part auto-doping during the formation of a new epitaxial layer on the opposing surface of the wafer. The defective epitaxial layer is then removed by a thinning procedure and, in effect, the wafer is inverted and reclaimed so that additional processing procedures may be performed. While this process enables semiconductor wafers to be reclaimed during the early stages of device fabrication, the process is limited in that once diffusions are performed in the initial epitaxial layer, the epitaxial layer itself is not sufficient to effectively eliminate the diffusion of impurities via the gas phase onto an epitaxial layer formed on the opposing surface.

Accordingly, it is an object of the present invention to provide a method for reclaiming partially fabricated semiconductor wafers after the diffusion steps have been performed. An additional object is the provision of a method of reclaiming semiconductor wafers wherein the effects of auto-doping are substantially eliminated. As a result, the present invention increases the yield of conventional semiconductor fabrication techniques and decreases the cost of the ultimate semiconductor device.

SUMMARY OF THE INVENTION

A process utilizing the teachings of the present invention is typically employed after an epitaxial layer has been grown on the semiconductor wafer and an opposite conductivity type region has been diffused therein. At this point in the fabrication of semiconductor devices, it is customary to measure the reverse breakdown characteristics of the semiconductor junction formed by the diffusion. These characteristics, for example, a low breakdown voltage, indicate the presence of an unacceptable epitaxial layer. In addition, the present process is utilized after a second region is diffused within the previously mentioned region. The measurement of the reverse characteristics of the junction between the diffused regions is normally indicative of the characteristics of these regions. When a wafer is recognized as unsuitable for the intended semiconductor device, the wafer is withdrawn from further fabrication processes and subjected to the present method.

The subject method includes the step of removing all layers previously formed on the surface of the epitaxial layer so that the surface thereof is exposed. Next, a passivating layer is formed on the exposed surface of the epitaxial layer. Then, any layers formed on the opposing surface of the wafer are removed to expose this surface. The opposing surface can then be polished to a finish acceptable for the growth of an epitaxial layer thereon. After formation of the new epitaxial layer, the wafer is again subjected to the conventional fabrication techniques. The combination of the first mentioned epitaxial layer and the passivating layer thereon can be removed by the standard thinning procedure presently used in device fabrication at the completion of the entire fabrication process. When this combination of layers is removed, the low resistivity wafer is exposed and electrical contact may be made thereto.

The combination of the initially formed epitaxial layer and any diffusions contained therein with the passivating layer overlying this epitaxial layer has been found to essentially eliminate any auto-doping occurring from diffused regions within this epitaxial layer during subsequent device fabrication and, in particular, during the formation of the epitaxial layer on the opposing side of the wafer. Since the first epitaxial layer contains impurities diffused therein, this layer alone is generally insufficient to reduce the effect of auto-doping. The overlying passivating layer, preferably an oxide layer, is required to have a thickness of at least 3000 angstroms in order to permit the formation of a relatively high resistivity second epitaxial layer on the opposing surface of the wafer.

DESCRIPTION OF THE PREFERRED EMBODIMENT

Figure 1:
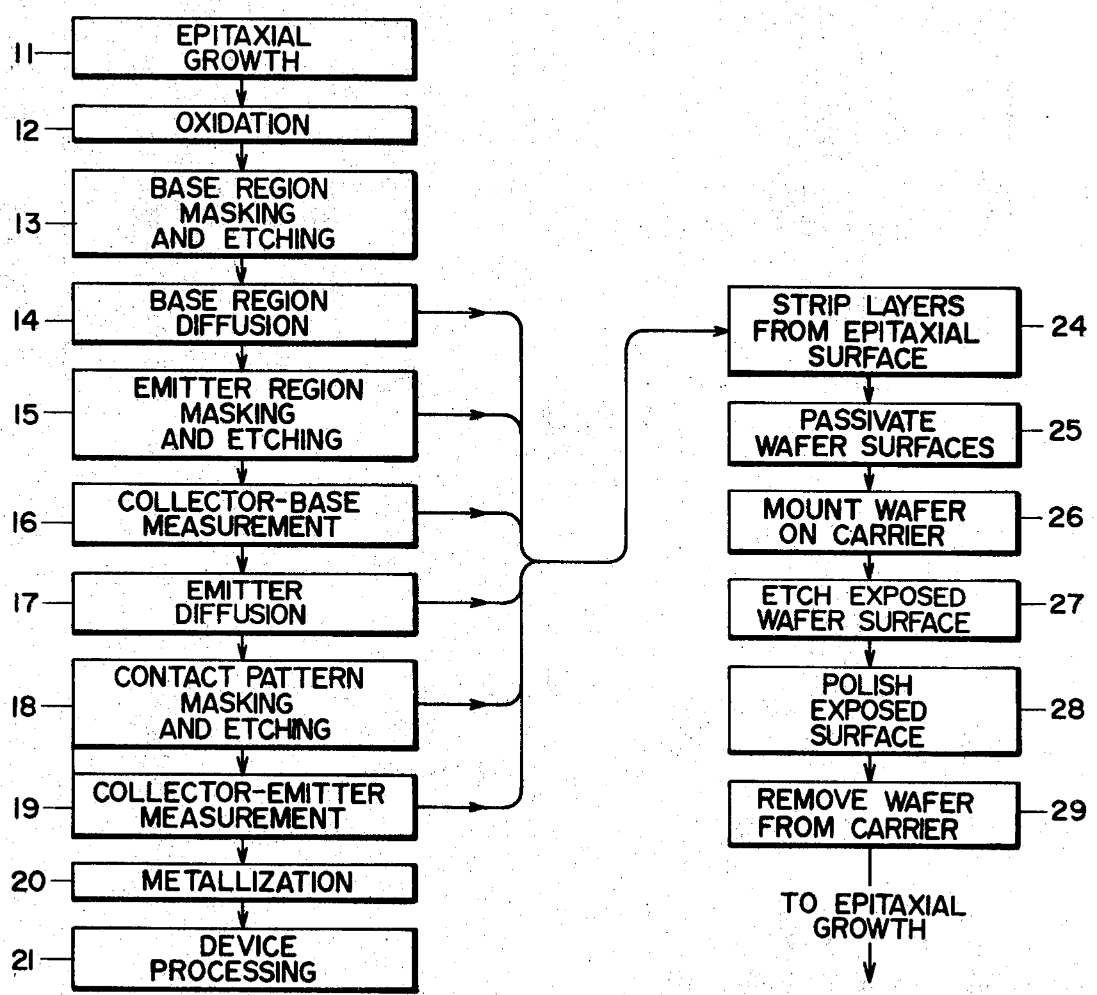
FIG. 1 is a simplified flow chart illustrating a process using the present invention.

Referring now to FIG. 1, the flow chart shows steps 11 through 21 utilized in the process for forming a semiconductor device subsequent to the conventional steps of growing doped monocrystalline material and forming polished wafers thereof. At this point, the wafer is ready for the growth of the epitaxial layer thereon.

After the epitaxial layer is formed on the surface of the wafer in step 11, an oxide layer is formed on the exposed surface of the epitaxial layer in step 12. This layer is etched in step 13 in a selective manner with the use of a mask to expose the intended base region. An impurity is diffused into the base region in step 14 to form a first PN junction within the wafer. In step 15, an additional mask layer is formed which defines the emitter region within the base region. This mask layer is selectively etched in a manner similar to that used in providing the base region during step 13. The provision of the base region within the epitaxial layer enables the collector-base semiconductor junction of the intended device to be readily subjected to electrical measurements. One of these measurements is the determination of the reverse-breakdown voltage of the semiconductor junction. The measured voltage is indicative of the resistivity of the epitaxial layer formed on the wafer in step 11. Thus, the measurement of step 16 enables the operator to readily determine whether the wafer and epitaxial layer thereon should be subjected to further processing steps or rejected at this point and removed from the fabrication process. The detection of defects midway in the process results in an economy in steps. However, the total yield, based on the ratio of acceptable devices to wafers exposed to at least one processing step, is unaffected by the time of testing.

Upon completion of the collector-base junction measurements, the emitter region is diffused within the base region in step 17 of FIG. 1. Following this step, the mask utilized for the metallization contact pattern is formed on the wafer surface. Typically, the metallization contact pattern is formed by a photographic process. When the mask pattern is formed, the collector-emitter measurements across both semiconductor junctions formed in the epitaxial layer are performed in step 19. These measurements are indicative of the resistivities of the base-emitter region and the spacing therebetween. If found unacceptable, the wafer may be rejected at this point prior to the metallization step 20 and withdrawn from the process. If the measurements and visual inspections performed during steps 11 and 19 of the process are satisfactory, then the metallization step, for example, the evaporation of aluminum, is performed. The device is then processed further in step 21 and incorporated in a suitable package.

The number and complexity of steps in the fabrication process of a semiconductor device generally result in a substantial number, for example, 25%, of all wafers exposed to at least one processing step being rejected. While wafers can be rejected during steps 11, 12 and 13 of FIG. 1, the process described in our aforementioned copending patent application, S.N. 643,475, now abandoned enables wafers rejected at this point to be reclaimed so that a new epitaxial layer can be formed thereon. The present method is concerned with the reclaiming of wafers found to be unsuitable for further processing but which have experienced at least one impurity diffusion therein. As noted in FIG. 1, flow lines to step 24 are provided for the steps 14 through 19 to signify the flow of wafers rejected during the fabrication steps. These wafers are subjected to steps 24 through 29 accordance with the invention to provide the reclaimed wafer suitable for use in epitaxial growth step 11.

The rejected wafers are reclaimed by the initial step 24 of stripping all layers from the epitaxial surface of the wafer. The stripping is preferably a chemical etching which removes all material from the surface of the epitaxial layer rather than a mechanical removal step which would tend to mechanically stress and weaken the wafer and epitaxial layer. The surface of the epitaxial layer is then passivated in step 25 by growing an oxide film thereover. The oxide film is utilized to essentially eliminate the effects of auto-doping on the new epitaxial layer to be grown upon completion of the reclaiming process. Since the previously formed epitaxial layer includes a diffused region, the layer itself has been found insufficient to eliminate the undesirable auto-doping. The minimum thickness of the oxide layer to prevent this auto-doping from the diffused region is about 3000 angstroms. In practice, the oxide layer thickness is made 7000 angstroms for the .008 to .02 ohm-centimeter semiconductor wafers generally utilized in commercial fabrication processes.

The passivation taking place in step 25 utilizes thermal oxidation of the wafer and epitaxial layer surfaces. As a result, an oxide film forms on both surfaces of the wafer. Next, the wafer is mounted in step 26 on a conventional carrier or pad. As is well known in the art, this pad is provided with a wax seat in which the wafer is slightly imbedded to effect a firm seat. The wafer is required to be mounted on the carrier so that the combination of the epitaxial layer and overlying passivation layer are adjacent the carrier. In other words, the surface of the wafer opposing the epitaxial layer is exposed for subsequent processing steps 27, 28 and 29. In step 27, the exposed opposing surface of the wafer is chemically etched to remove the oxide layer formed thereon. In the event that any diffusion has inadvertently occurred in this opposing surface during the initial processing steps, the wafer can be thinned during this step to remove the adjacent portion of the wafer containing these diffusions. Then, with the wafer continuing to be mounted on the carrier, the exposed surface of the wafer is polished in step 28. The reclaiming process is completed by the removal of the wafer from the wax seat on the carrier in step 29.

Since the wafer is mounted on the carrier in step 26 with the epitaxial layer and the overlying oxide layer adjacent the carrier, the mechanical removal of the wafer from the carrier does not affect the polished exposed surface of the wafer. In addition, the presence of the oxide layer overlying the epitaxial layer not only serves to eliminate auto-doping but also protects the wafer during the mechanical removal. When so removed, the reclaimed wafer is then recycled back to epitaxial growth step 11 wherein a new high resistivity epitaxial layer can be formed on the exposed wafer surface with the oxide layer serving to inhibit any auto-doping from the diffused region in the initially or first formed epitaxial layer. Upon completion of the entire processing steps 11 through 20 without rejection, the combination of the oxide film and first formed epitaxial layer are removed by the conventional wafer-thinning process prior to mounting on a header or other package. It shall be noted that the present reclaiming process enables wafers rejected during steps 14 through 19 to be reused rather than discarded. Upon the completion of the measurements in step 19, the structure is subjected to metallization step 20 wherein the electrode pattern is formed. The metallization and the heat treatment typically performed during this step may also result in defective wafers. However, the metal deposited on the diffused regions is found to affect the lifetime of the carriers within the region and, as a result of the heat treatment, normally alters the lifetime within the wafer. Consequently, the present method is directed to reclaiming wafers prior to the metalilzation step 20 of FIG. 1.

Figure 2:
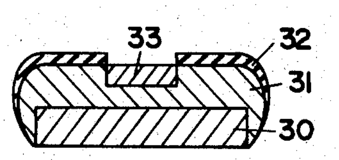
FIG. 2 is a view in cross section of a semiconductor wafer formed after step 14 of FIG. 1.
Figure 3:
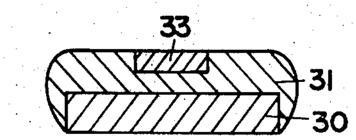
FIG. 3 is a view in cross section of a semiconductor wafer formed after step 24 of FIG. 1.
Figure 4:
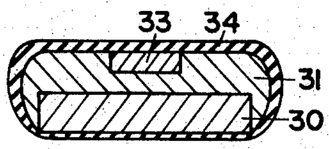
FIG. 4 is a view in cross section of a semiconductor wafer formed after step 25 of FIG. 1.
Figure 5:
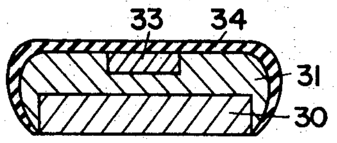
FIG. 5 is a view in cross section of a semiconductor wafer formed after step 29 of FIG. 1.

The structure of the wafer during various steps in the previously described processes is shown in FIGS. 2–5. In FIG. 2, the wafer 30 is shown having epitaxial layer 31 formed thereon. The base region masking and etching step 13 has been performed and the base region 33 has been diffused into the epitaxial layer 31. Assuming this wafer has been found unacceptable for further processing steps after the measurement step 16, it is then subjected to stripping step 24 which removes oxide layer 32 from the surface of epitaxial layer 31. The structure shown in FIG. 4 illustrates the oxide layer 34 formed during passivation step 25. The wafer is then mounted in step 26 on the carrier and the exposed surface is etched in step 27 to remove that portion of oxide layer 35 overlying the opposing surface of wafer 30. The wafer is then removed from the carrier and subjected to epitaxial semiconductor material formation in growth step 11.

While the above description has referred to a specific embodiment of the invention, it will be recognized that many modifications and variations may be made therein without departing from the spirit and scope of the invention.

We claim:

1. A method of reclaiming semiconductor wafers having an epitaxial layer formed on one surface thereof comprising the steps of:

(a) removing layers formed on the surface of said epitaxial layer to expose the surface thereof;

(b) forming a passivating layer on the surface of said epitaxial layer;

(c) removing layers formed on the opposing surface of said wafer to expose said opposing surface, and (d) polishing said exposed surface for epitaxial semiconductor material formation, said wafer being reclaimed for use in device fabricating processes.

2. The method of claim 1 wherein said passivating layer formed on the surface of the epitaxial layer has a thickness of approximately 7000 angstroms.

3. The method of claim 2 wherein said passivating layer is an oxide layer having a thickness of at least 3000 angstroms.

4. The method of claim 2 wherein said passivating layer is formed on the surface of the epitaxial layer and on the opposing surface of the wafer.

5. The method of claim 4 wherein the removal step comprises etching the surface of said layer.

6. The method of claim 4 wherein the removal step includes removing layers formed on the opposing surface of said surface and removing the adjacent portion of the wafer containing diffused regions therein.

7. The method of claim 4 wherein the step of polishing said exposed surface comprises the steps of:

(a) mounting the wafer on a carrier with the surface containing the oxide layer adjacent to the carrier;

(b) mechanically polishing the exposed surface of said wafer, and (c) removing the wafer from the carrier.

References Cited

UNITED STATES PATENTS

| | | | |
|---|---|---|---|
| 3,184,823 | 5/1965 | Little et al. | 29—590X |
| 3,243,323 | 3/1966 | Corrigan et al. | |
| 3,345,222 | 10/1967 | Nomura et al. | |

OTHER REFERENCES

Doo et al.: "Growing High Resistivity Epitaxial Films on Low Resistivity Silicon Substrates," IBM Technical Disclosure Bulletin, vol. 5, No. 2, July 1962 (pp. 50 and 51).

JOHN F. CAMPBELL, Primary Examiner

W. TUPMAN, Assistant Examiner

U.S. Cl. X.R.

29—591; 148—175